US012601792B2

(12) United States Patent
Siroma

(10) Patent No.: US 12,601,792 B2
(45) Date of Patent: Apr. 14, 2026

(54) BATTERY PACK AND ASSESSMENT METHOD

(71) Applicant: NATIONAL INSTITUTE OF ADVANCED INDUSTRIAL SCIENCE AND TECHNOLOGY, Tokyo (JP)

(72) Inventor: Zyun Siroma, Ikeda (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 155 days.

(21) Appl. No.: 18/694,080

(22) PCT Filed: Sep. 9, 2022

(86) PCT No.: PCT/JP2022/033852
§ 371 (c)(1),
(2) Date: Mar. 21, 2024

(87) PCT Pub. No.: WO2023/047978
PCT Pub. Date: Mar. 30, 2023

(65) Prior Publication Data
US 2024/0385257 A1 Nov. 21, 2024

(30) Foreign Application Priority Data
Sep. 24, 2021 (JP) ................................. 2021-155462

(51) Int. Cl.
*G01R 31/389* (2019.01)
*G01R 31/396* (2019.01)
(Continued)

(52) U.S. Cl.
CPC ......... *G01R 31/396* (2019.01); *G01R 31/389* (2019.01); *H01M 10/4264* (2013.01); *H01M 10/482* (2013.01); *H01M 50/519* (2021.01)

(58) Field of Classification Search
CPC .......... G01R 31/3835; H01M 10/4228; H01M 10/4285; H01M 2250/20
(Continued)

(56) References Cited

U.S. PATENT DOCUMENTS

2013/0335028 A1 12/2013 Choi
2014/0315047 A1 10/2014 Cattin et al.
(Continued)

FOREIGN PATENT DOCUMENTS

CN 103516013 A 1/2014
DE 102013218081 A1 3/2015
(Continued)

OTHER PUBLICATIONS

Notice of Reasons for Refusal from JP Application No. 2023-549473 dated Dec. 10, 2024, 5 pages, [machine translation].
(Continued)

*Primary Examiner* — Huy Q Phan
*Assistant Examiner* — Trung Q Nguyen
(74) *Attorney, Agent, or Firm* — Shih IP Law Group, PLLC

(57) ABSTRACT

This battery pack comprises: an electric circuit element part which is for use in assessment of a plurality of secondary batteries and which is disposed so as to be connectable to the plurality of secondary batteries; and a switching part connected to the electric circuit element part and to the plurality of secondary batteries and configured so that the impedance characteristics of the entirety of the battery pack can be switched between when the electric circuit element part is used and when the electric circuit element part is not used.

12 Claims, 6 Drawing Sheets

(51) Int. Cl.
 *H01M 10/42*   (2006.01)
 *H01M 10/48*   (2006.01)
 *H01M 50/519*   (2021.01)

(58) Field of Classification Search
 USPC .................... 324/500, 600, 76.11, 415–435
 See application file for complete search history.

(56)      References Cited

U.S. PATENT DOCUMENTS

| | | | |
|---|---|---|---|
| 2017/0307693 A1* | 10/2017 | Fukuda | G01B 21/32 |
| 2018/0166911 A1* | 6/2018 | Ionescu | B60L 58/16 |
| 2018/0238937 A1* | 8/2018 | Nakajima | G03G 15/5037 |
| 2019/0067758 A1* | 2/2019 | Yamada | H02J 7/00 |
| 2019/0271747 A1* | 9/2019 | Osaka | G01R 31/367 |
| 2020/0036058 A1 | 1/2020 | van Lammeren | |
| 2020/0091742 A1* | 3/2020 | Yamashita | H02J 7/61 |
| 2020/0412159 A1 | 12/2020 | Snyder | |
| 2022/0103079 A1* | 3/2022 | Hariya | G01R 19/0092 |
| 2024/0142534 A1* | 5/2024 | Ropel | B60L 3/12 |

FOREIGN PATENT DOCUMENTS

| | | | |
|---|---|---|---|
| JP | 2018-179652 A | 11/2018 | |
| WO | 2018186423 A1 | 10/2018 | |

OTHER PUBLICATIONS

Extended European Search Report from EP Application No. 22872733.5 mailed Sep. 16, 2025, 26 pages.
International Search Report from International Application No. PCT/JP2022/033852 mailed Nov. 1, 2022.

\* cited by examiner

1

BATTERY PACK AND ASSESSMENT METHOD

TECHNICAL FIELD

The present invention relates to a battery pack and an assessment method.

BACKGROUND ART

For a battery pack composed of a plurality of secondary batteries, it is required to be able to easily assess the condition of the battery pack, specifically, the condition of each of the secondary batteries composing the battery pack, without destroying a product on which the battery pack is mounted. In particular, for a battery pack mounted on an electric car (vehicle), there is an increasing need for a user to understand the condition of the battery pack in a non-destructive manner, considering that the vehicle is traded in a used market.

A conventionally known method of assessing individual secondary batteries inside a battery pack is a method in which information on a secondary battery can be extracted only by measuring an impedance characteristic of the entire battery pack. For example, Patent Literature (hereinafter, referred to as PTL) 1 discloses an apparatus in which different label elements with different impedance characteristics are respectively added in parallel to a plurality of secondary batteries in order to apply different modulations to the impedance characteristics of the secondary batteries, in a battery pack composed of the plurality of secondary batteries connected in series.

CITATION LIST

Patent Literature

PTL 1
Japanese Patent Application Laid-Open No. 2018-179652

SUMMARY OF INVENTION

Technical Problem

The method disclosed in PTL 1, however, limits an assumed internal configuration of the battery pack to a configuration in which the secondary batteries are connected in series, and the number of label elements that can be used simultaneously is limited. In addition, obtainable information is also limited to the impedance characteristic around the frequency assumed in the design stage of the label element. That is, it is difficult to determine the presence or absence of a secondary battery in a deteriorated state only by measuring a change in the impedance characteristic of the entire battery pack as in the conventional method, and it is difficult to understand the condition of each secondary battery. Meanwhile, a method of measuring the condition of each secondary battery by disassembling a battery pack or a method of adding to a battery pack a configuration for outputting an electrical characteristic of each secondary battery externally is not practical for application to products distributed on the market. Thus, a configuration capable of easily understanding the conditions of a plurality of secondary batteries is desired.

It is an object of the present invention to provide a battery pack and an assessment method each capable of understanding the conditions of a plurality of secondary batteries easily.

Solution to Problem

A battery pack according to the present invention includes a plurality of secondary batteries, and the battery pack is capable of assessing at least one of the plurality of secondary batteries and includes: an electrical circuit element section that is used in assessing the plurality of secondary batteries and is placed such that it is connectable to at least one of the plurality of secondary batteries; and a switching section that is connected to the electrical circuit element section and at least one of the plurality of secondary batteries and is configured to be capable of switching an impedance characteristic of the battery pack as a whole between use of the electrical circuit element section and non-use of the electrical circuit element section.

An assessment method according to the present invention is for a battery pack including a plurality of secondary batteries, an electrical circuit element section that is used in assessing at least one of the plurality of secondary batteries and is placed such that it is connectable to at least one of the plurality of secondary batteries, and a switching section that is connected to the electrical circuit element section and at least one of the plurality of secondary batteries, and the method includes: switching an impedance characteristic of the battery pack as a whole between use of the electrical circuit element section and non-use of the electrical circuit element section; and assessing at least one of the plurality of secondary batteries.

Advantageous Effects of Invention

According to the present invention, it is possible to understand the conditions of a plurality of secondary batteries easily.

DESCRIPTION OF EMBODIMENTS

Figure 1:
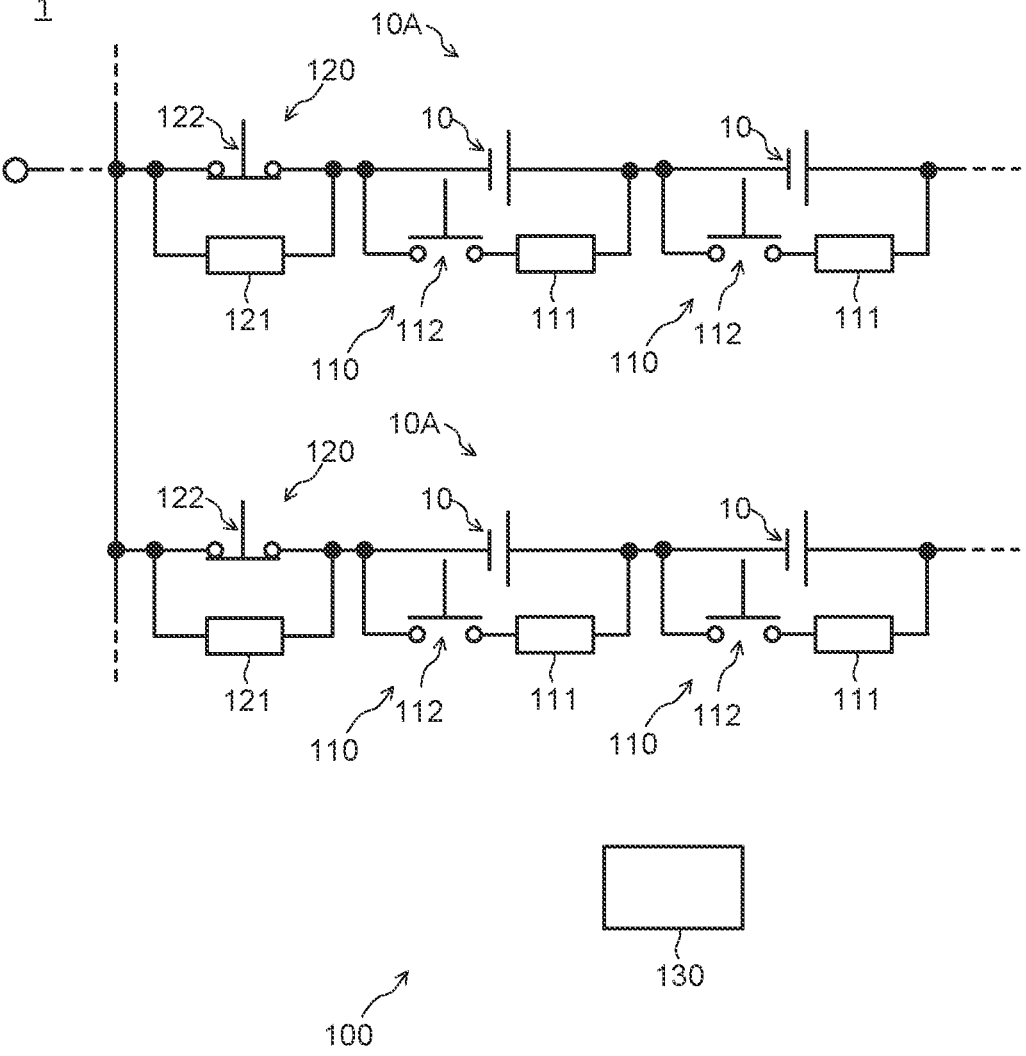
FIG. 1 illustrates an exemplary configuration of a battery pack according to the present invention.

Hereinafter, an embodiment of the present invention will be described in detail with reference to the accompanying drawings. FIG. 1 illustrates an exemplary configuration of a battery pack 1 according to the present invention.

The battery pack 1 is, for example, a battery pack mounted on a vehicle such as an electric car and includes a plurality of secondary batteries 10 and an assessment section 100.

The plurality of secondary batteries 10 are, for example, lithium-ion batteries, and supply power to a load (not illustrated) connected thereto. In addition, the plurality of secondary batteries 10 are supplied with power from an external power source at the time of charging. The plurality of secondary batteries 10 are connected in series or in parallel. In the present embodiment, n series groups 10A in which m secondary batteries 10 are connected in series are connected in parallel with each other. The m and n are any numbers greater than or equal to 2.

The assessment section 100 is configured to be able to assess the plurality of secondary batteries 10, and includes first circuit sections 110, second circuit sections 120, and a control section 130.

The plurality of first circuit sections 110 are provided corresponding to the plurality of secondary batteries 10 respectively, and each include a parallel element section 111 and a first switching section 112.

The plurality of second circuit sections 120 are provided corresponding to the plurality of series groups 10A in the battery pack 1 respectively, and each include a series element section 121 and a second switching section 122.

First, the second circuit section 120 will be described in detail. The series element section 121 is, for example, an electrical circuit element section such as a coil, and is connected in series with the plurality of secondary batteries 10 included in each series group 10A. The series element section 121 is not used when the power of the plurality of secondary batteries 10 can be inputted and outputted, and is used when the plurality of secondary batteries 10 are assessed. The series element sections 121 have the same electrical parameter. The electrical parameter is a generic term for a parameter that determines a characteristic of the element, such as capacitance, inductance, and resistance.

The second switching section 122 is, for example, a switching circuit section such as a switching element and a relay element, and is placed in parallel with each series element section 121. The second switching section 122 is configured to be able to switch wires 1C (see FIG. 2B), to which both ends of the second switching section 122 are connected, between a conductive state and a non-conductive state.

The second switching section 122 is in the conductive state (see FIG. 1 and the two-dot-dash line of FIG. 2B) when the series element section 121 is not used. The second switching section 122 is in the non-conductive state (see the solid line of FIG. 2B) when the series element section 121 is used.

The switching of the second switching section 122 between when the series element section 121 is used and not used in this manner causes a difference in the impedance characteristic between when the series element section 121 is used and not used. For example, the change in the impedance characteristics in one series group 10A and in one series element section 121 and one second switching section 122 is checked when the series element section 121 is used and not used.

For example, the impedance of the series group 10A portion is Zx, and the impedance of the series element section 121 portion is Zs. When the series element section 121 is not used, i.e., when the second switching section 122 is in the conductive state, the admittance of the entire circuit portion including the secondary batteries 10 and the series element section 121 is 1/Zx.

Meanwhile, when the series element section 121 is used, i.e., when the second switching section 122 is in the non-conductive state, the admittance of the entire circuit portion including the series group 10A and the series element section 121 is 1/(Zx+Zs). As a consequence, ΔY, which is a difference in the admittance between when the series element section 121 is used and not used, is 1/Zx−1/(Zx+Zs). Zx can be calculated from this ΔY and the above Zs.

As described above, in the present embodiment, it is possible to cause a difference in the impedance (admittance) characteristic of the entire battery pack 1 by switching the second switching section 122 between when the series element section 121 is used and not used. Thus, separately switching each of the plurality of second switching sections 122 makes it easier to determine whether the secondary batteries 10 included in which series group 10A are deteriorated.

Note that the electrical parameter of the series element section 121 can be set to any value according to an assumed noise amount or the like. A larger value of the above ΔY regarding the series element section 121 is better from the viewpoint of accuracy improvement, and thus it is preferable that Zs is as large as possible for the electrical parameter of the series element section 121.

Next, the first circuit section 110 will be described in detail. The parallel element section 111 is, for example, an electrical circuit element section such as a capacitor, and is placed in parallel with the secondary battery 10. A plurality of the parallel element sections 111 are provided corresponding to the plurality of secondary batteries 10 respectively, not used when the power of the plurality of secondary batteries 10 can be inputted and outputted, and used when the plurality of secondary batteries 10 are assessed. In addition, the parallel element sections 111 each have the same electrical parameter.

The first switching section 112 is, for example, a switching circuit section such as a switching element and a relay element, and is connected in series with each parallel element section 111. The first switching section 2 is configured to be able to switch the parallel element section 111 and the secondary battery 10 between a connected state and a disconnected state.

Figure 2A:
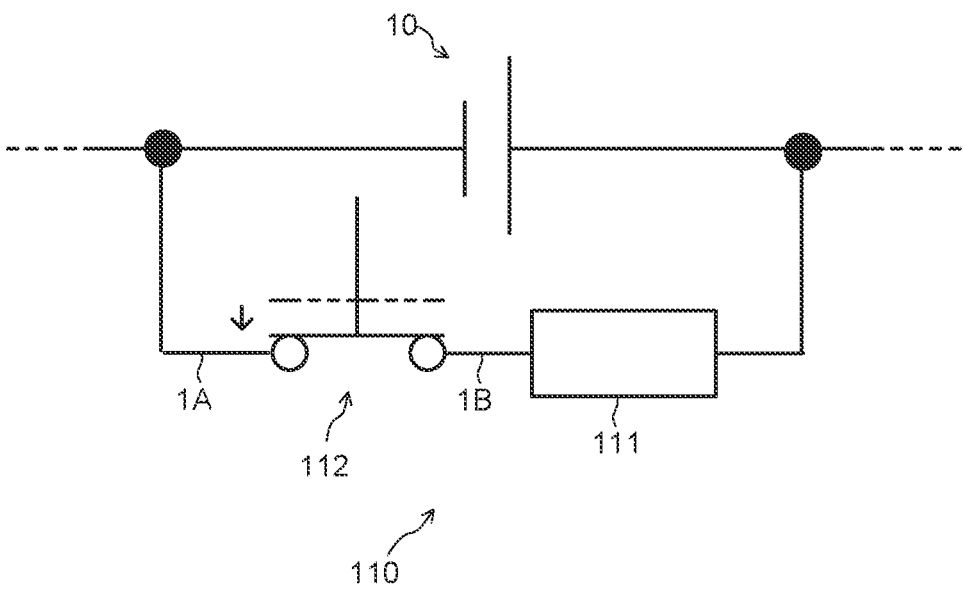
FIG. 2A illustrates a parallel element section in an assessment of a secondary battery.
Figure 2B:
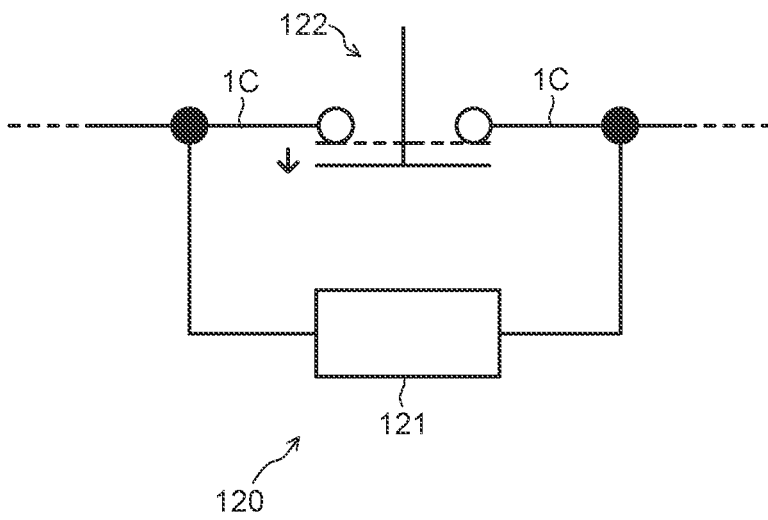
FIG. 2B illustrates a series element section in an assessment of a secondary battery.

A case where the parallel element section 111 and the secondary battery 10 are in the connected state corresponds to a case where a wire 1A to which one end of the first switching section 112 is connected and a wire 1B to which the other end is connected are in the conductive state (see the solid line in FIG. 2A). A case where the parallel element section 111 and the secondary battery 10 are in the disconnected state corresponds to a case where the wire 1A to which one end of the first switching section 112 is connected and the wire 1B to which the other end is connected are in the non-conductive state (see FIG. 1 and the two-dot-dash line of FIG. 2A).

When the parallel element section 111 is not used, the first switching section 112 sets the parallel element section 111 and the secondary battery 10 in the disconnected state (see the two-dot-dash line of FIG. 2A). When the parallel element section 111 is used, the first switching section 112 sets the parallel element section 111 and the plurality of secondary batteries 10 in the connected state (see the solid line of FIG. 2A).

Switching the first switching section 112 between when the parallel element section 111 is used and not used in this manner causes a difference in the impedance characteristic between when the parallel element section 111 is used and not used. For example, the change in the impedance characteristics in one secondary battery 10 and in one parallel element section 111 and one first switching section 112 is checked when the parallel element section 111 is used and not used.

For example, the impedance of the secondary battery 10 portion is Zx, and the impedance of the parallel element section 111 portion is Zp. When the parallel element section 111 is not used, i.e., when the parallel element section 111 and the secondary battery 10 are in the disconnected state, the impedance of the entire series group 10A including the secondary battery 10 and the parallel element section 111 is Zx.

Meanwhile, when the plurality of secondary batteries 10 are assessed, i.e., when the parallel element section 111 and the secondary battery 10 are in the connected state, the impedance of the entire series group 10A including the secondary battery 10 and the parallel element section 111 is $Zx \cdot Zp/(Zx+Zp)$. As a consequence, $\Delta Z$, which is a difference between when the secondary battery 10 is used and assessed, is $Zx-Zx \cdot Zp/(Zx+Zp)$. $Zx$ can be calculated from this $\Delta Z$ and the above $Zp$.

As described above, in the present embodiment, it is possible to cause a difference in the impedance characteristic of the entire series group 10A by switching the first switching section 112 between when the parallel element section 111 is used and not used. Thus, separately switching each of the plurality of first switching sections 112 makes it easier to determine which secondary battery 10 is deteriorated.

Note that the electrical parameter of the parallel element section 111 can be set to any value according to an assumed noise amount or the like. A larger value of the above $\Delta Z$ regarding the parallel element section 111 is better from the viewpoint of accuracy improvement, and thus it is preferable that $Zp$ is as small as possible for the electrical parameter of the parallel element section 111.

The impedance of the secondary battery 10 is calculated by switching each of the first switching section 112 and the second switching section 122. For example, in order to calculate the impedance of a particular secondary battery 10, the impedance of the entire battery pack 1 is measured under four conditions of the first measurement, the second measurement, the third measurement, and the fourth measurement.

The condition of the first measurement is a condition in which all first switching sections 112 are in the non-conductive state (the parallel element sections 111 are in the disconnected state) and all second switching sections 122 are in the conductive state. This is the same condition as when the battery pack 1 supplies power and is supplied with power.

The condition of the second measurement is a condition in which all first switching sections 112 are in the non-conductive state, the second switching section 122 corresponding to the series group 10A including the particular secondary battery 10 is in the non-conductive state, and the second switching sections 122 corresponding to the other series groups 10A are in the conductive state.

The condition of the third measurement is a condition in which the first switching section 112 corresponding to the particular secondary battery 10 is in the conductive state (the parallel element section 111 is in the connected state), the other first switching sections 112 are in the non-conductive state, and all second switching sections 122 are in the conductive state.

The condition of the fourth measurement is a condition in which the first switching section 112 corresponding to the particular secondary battery 10 is in the conductive state, the other first switching sections 112 are in the non-conductive state, the second switching section 122 corresponding to the series group 10A including the particular secondary battery 10 is in the non-conductive state, and the second switching sections 122 corresponding to the other series groups 10A are in the conductive state.

The impedance of the particular secondary battery 10 can be measured based on the impedance of the entire battery pack 1 measured under the above four conditions. Note that the above conditions are examples, and any condition may be used as long as the impedance of the secondary battery 10 can be measured.

The control section 130 is, for example, an electronic control section (ECU) mounted on a vehicle, and includes a central processing unit (CPU), read only memory (ROM), random access memory (RAM), and input/output circuitry that are not illustrated. The control section 130 performs control to switch the first switching section 112 and the second switching section 122 between when the electrical circuit element section is used and not used, based on a preset program.

Note that, in the assessment section 100, it is not limited to this, and the first switching section 112 and the second switching section 122 may be switched by, for example, a manual operation of a user. In this case, for example, a measurement device is connected to the battery pack 1, and the secondary battery 10 in a deteriorated state is determined by user's visual inspection etc.

The control section 130 may perform control to switch the first switching section 112 and the second switching section 122 by combining the first measurement, the second measurement, the third measurement, and the fourth measurement described above, to finally measure the impedances of the secondary batteries 10 composing the entire battery pack 1.

This makes it possible to understand a change in the impedance characteristic of each secondary battery 10.

In addition, the control section 130 may perform control to notify a user of an assessment result of the battery pack 1. As the assessment result of the battery pack 1, information such as the presence or absence of the secondary battery 10 in the deteriorated state and which secondary battery 10 is in the deteriorated state is obtained.

Further, the notification of the assessment result may be in any way as long as a user can receive the notification, such as displaying information related to the assessment result on a display device and outputting the information by voice or the like.

Figure 3:
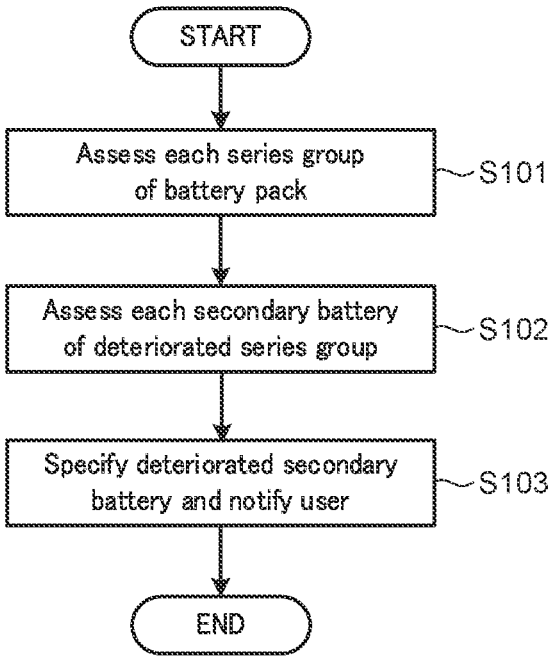
FIG. 3 is a flowchart describing an exemplary method of assessing a battery pack in an assessment section.

Next, an exemplary assessment method for the battery pack 1 in the assessment section 100 will be described. FIG. 3 is a flowchart describing the exemplary assessment method for the battery pack 1 in the assessment section 100.

As illustrated in FIG. 3, the control section 130 switches the state of each second switching section 122 to assess each series group 10A in the battery pack 1 (step S101).

In step S101, for example, it is assumed that a deteriorated series group 10A is present when the difference in the impedance in each series group 10A measured by the above first measurement and second measurement is large.

Next, when the deteriorated series group 10A is present, the control section 130 switches the state of each first switching section 112 and assesses each of secondary batteries 10 of that series group 10A (step S102).

In step S102, each of the secondary batteries 10 is assessed by performing the above first measurement, second measurement, third measurement, and fourth measurement on each of the secondary batteries 10 of the deteriorated series group 10A, for example.

After step S102, the control section 130 specifies a deteriorated secondary battery 10 and performs processing for notifying a user (step S103). This control is terminated after step S103.

According to the present embodiment configured as described above, the impedance characteristic of the entire battery pack 1 is switched between when the electrical circuit element section is used and not used.

To be more specific, by switching the first switching section 112 corresponding to the secondary batteries 10 connected in series with each other (in the case of FIG. 5 described later, a parallel group 10B connected in series with each other), a change in the impedance of the entire secondary batteries 10 connected in series with each other can be associated with a value of a particular secondary battery 10; accordingly, the impedance of each secondary battery 10 can be calculated individually.

That is, in the present embodiment, it is possible to break down the sum of the impedances of the secondary batteries 10 connected in series with each other into the impedances of the respective secondary batteries 10, which are the components. As a result, a deteriorated secondary battery 10 can be specified more easily, and thus the states of the plurality of secondary batteries 10 can be easily understood.

Further, in the present embodiment, the impedance characteristic of the entire battery pack 1 is switched by using the parallel element section 111 and the series element section 121 together. That is, the impedances of the respective series groups 10A can be calculated by separately switching the second switching sections 122 corresponding to the series element sections 121. To be more specific, by switching the second switching sections 122, the impedances of the respective series groups 10A can be individually calculated from the impedance of the entire series groups 10A (the secondary batteries 10, in the case of FIG. 5 described later) connected in parallel with each other. That is, the sum of admittances of the series groups 10A connected in parallel with each other can be broken down into the admittances of the respective series groups 10A, which are the components.

In addition, by separately switching the first switching sections 112 corresponding to the parallel element sections 111 in each series group 10A, the impedances of the respective secondary batteries 10 in the series group 10A can be calculated.

Thus, the impedance of each of the secondary batteries 10 can be calculated even in a configuration including a plurality of secondary batteries 10 for which a series connection and a parallel connection are combined, thereby improving the assessment efficiency.

Further, since the plurality of parallel element sections 111 or the plurality of series element sections 121 have the same electrical parameter, it is possible to easily calculate the impedance as compared with a configuration with different electrical parameters.

In addition, since it is not necessary to prepare elements with different electrical parameters, manufacturing processing of the battery pack can be simplified.

Figure 4A:
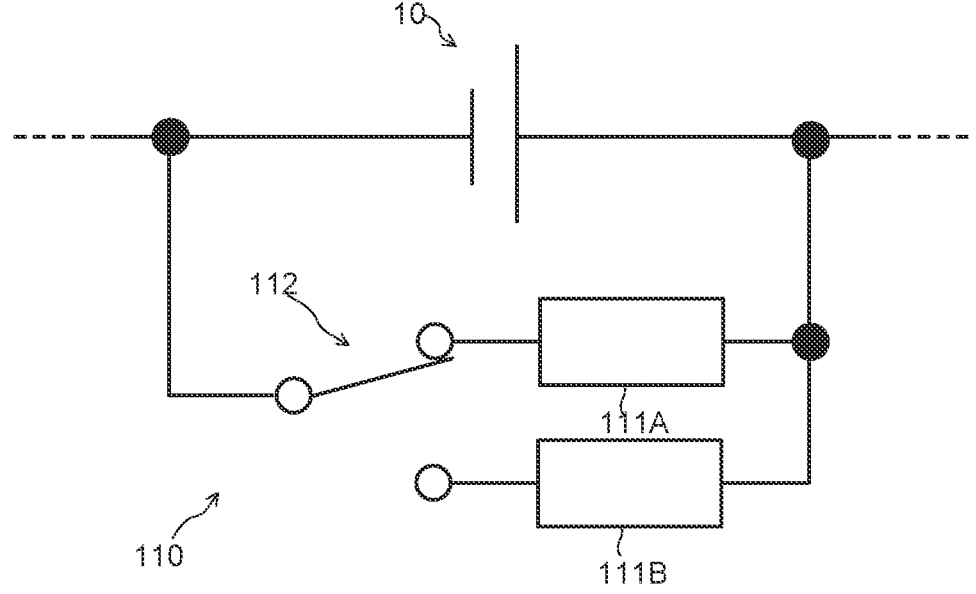
FIG. 4A illustrates an example of the parallel element section according to a variation.

Note that, although the first switching section 112 is connected to one parallel element section 111 in the above embodiment, the present invention is not limited to this. For example, the first switching section 112 may be configured to be connected to either one of two parallel element sections 111A and 111B as illustrated in FIG. 4A.

In this configuration, the first circuit section 110 includes a first parallel element section 111A, a second parallel element section 111B, and the first switching section 112. The first parallel element section 111A and the second parallel element section 111B have different electrical parameters.

The first switching section 112 is connected to the first parallel element section 111A when the first parallel element section 111A is used and the second parallel element section 111B is not used, and is connected to the second parallel element section 111B when the first parallel element section 111A is not used and the second parallel element section 111B is used. Note that, in this configuration, a parallel element section connected (used) at the time of the assessment of the battery pack 1 may be determined freely.

As described above, by switching the connection to the secondary battery 10 using either the first parallel element section 111A or the second parallel element section 111B, the electrical parameter of the parallel element section can be different between when used and not used.

That is, the impedance characteristic of the entire battery pack 1 can also be switched in this manner between when each parallel element section is used and not used; accordingly, the impedance of each of the secondary batteries 10 can be calculated, and the states of the plurality of secondary batteries can be easily understood.

Figure 4B:
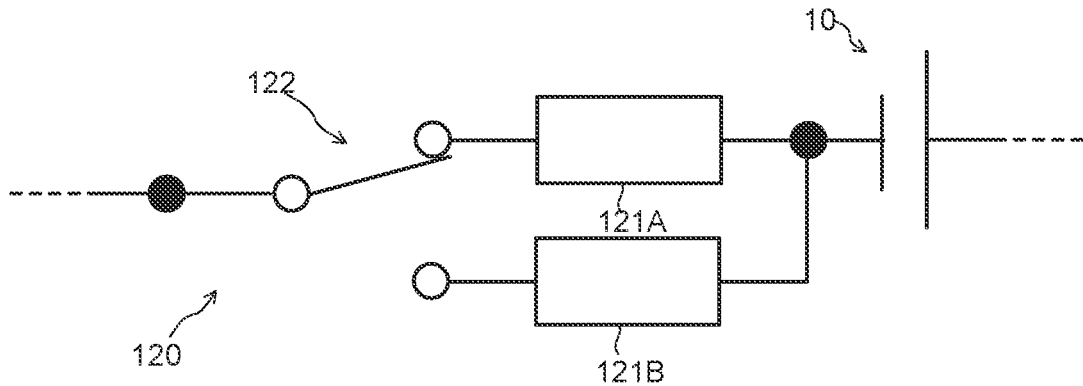
FIG. 4B illustrates an example of the series element section according to a variation.

Note that, although the second switching section 122 is connected to one series element section 121 in the above embodiment, the present invention is not limited to this. For example, the second switching section 122 may be configured to be connected to one of two series element sections 121A and 121B as illustrated in FIG. 4B.

In this configuration, the second circuit section 120 includes a first series element section 121A, a second series element section 121B, and the second switching section 122. The first series element section 121A and the second series element section 121B have different electrical parameters.

The second switching section 122 is connected to the first series element section 121A when the first series element section 121A is used and the second series element section 121B is not used, and is connected to the second series element section 121B when the first series element section 121A is not used and the second series element section 121B is used. Note that, in this configuration, a series element section connected (used) at the time of the assessment of the battery pack 1 may be determined freely.

As described above, by switching the connection to the secondary battery 10 using either the first series element section 121A or the second series element section 121B, the electrical parameter of the series element section can be different between when used and not used.

That is, the impedance characteristic can also be switched in this manner between when each series element section is used and not used; accordingly, the impedance of each of the series groups 10A can be calculated, and the states of the plurality of secondary batteries can be easily understood.

Further, since the switching section is connected to any one of the electrical circuit element sections in the configurations illustrated in FIG. 4A and FIG. 4B, non-ideality of the switching section (variation in on-resistance and off-resistance) can be cancelled by any one of the electrical circuit element sections.

In the configurations illustrated in FIG. 4A and FIG. 4B, the electrical parameter of the element section can be adjusted by providing two (a plurality of) parallel element sections or series element sections having different electrical parameters, but the present invention is not limited to this. For example, the parallel element section or the series element section may be a variable element (variable resistance, variable capacitor, etc.), so that the parallel element section or the series element section is configured to be able to adjust the electrical parameter. The switching section in this case is, for example, an operation section or the like that can adjust the electrical parameter of the variable element.

Figure 5:
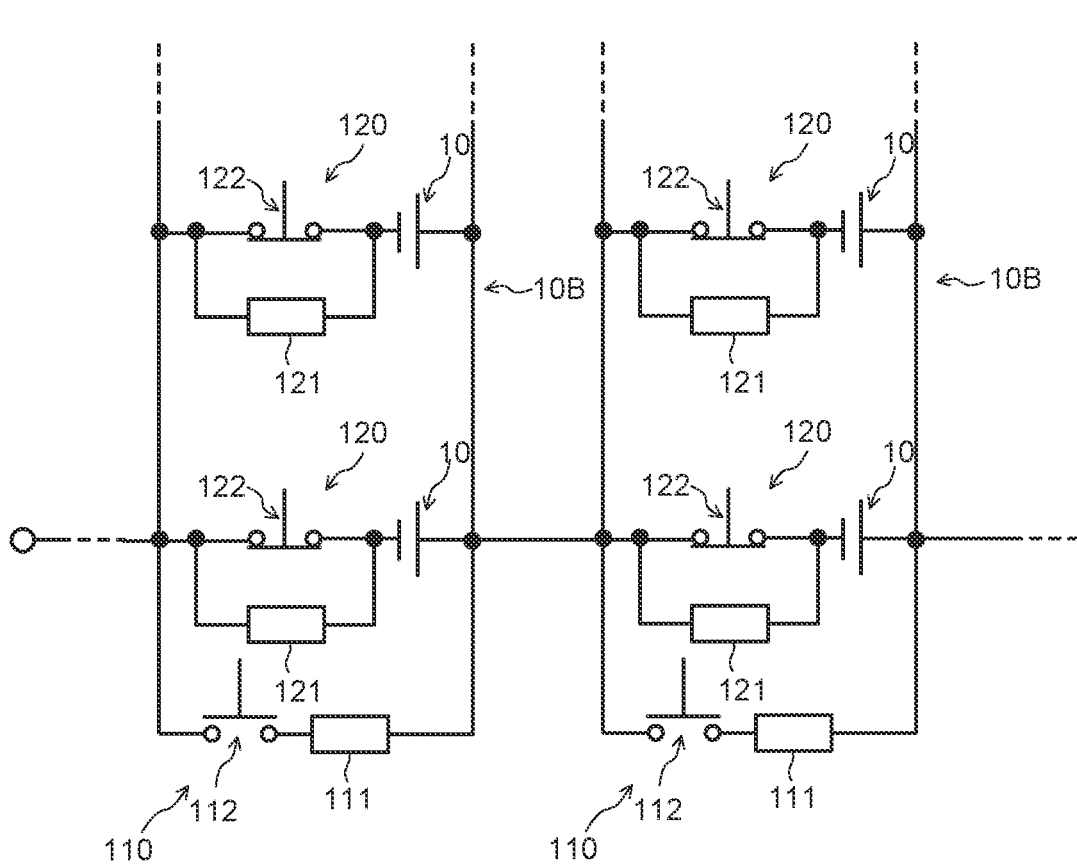
FIG. 5 illustrates an exemplary configuration of the battery pack according to a variation.

In the above embodiment, the battery pack 1 is configured to include a group of secondary batteries connected in series, but the present invention is not limited to this. For example, as illustrated in FIG. 5, the battery pack 1 may be configured to include a parallel group 10B of the secondary batteries 10 connected in parallel.

In this configuration, one first circuit section 110 is provided to each parallel group 10B, and the second circuit section 120 is provided corresponding to each of the plurality of secondary batteries 10 in each parallel group 10B.

To be more specific, the parallel element section 111 is connected in parallel with each parallel group 10B. The first switching section 112 is connected in series with the parallel element section 111 and is connected in parallel with each parallel group 10B. The series element section 121 is connected in series with each secondary battery 10. The second switching section 122 is connected in parallel with the series element section 121 and is connected in series with the secondary battery 10.

The first switching section 112 sets the parallel element section 111 and the parallel group 10B to the disconnected state when the parallel element section 111 is not used, and sets the parallel element section 111 and the parallel group 10B to the connected state when the parallel element section 111 is used. The second switching section 122 is brought into the conductive state when the series element section 121 is not used, and is brought into the non-conductive state when the series element section 121 is used.

In such a configuration, the impedance characteristic of the parallel group 10B can be calculated from the impedance characteristic of the entire battery pack by using the first circuit section 110. Further, the impedance of each of the secondary batteries 10 can be calculated from the impedance of the parallel group 10B by using the second circuit section 120. As a result, the states of the plurality of secondary batteries 10 can also be easily understood in such a configuration.

Note that, although the parallel element section 111 is provided corresponding to one secondary battery 10 in the above embodiment, the present invention is not limited to this. For example, as illustrated in FIG. 6A and FIG. 6B, it may be provided corresponding to two or more secondary batteries 10 connected in series.

Figure 6A:
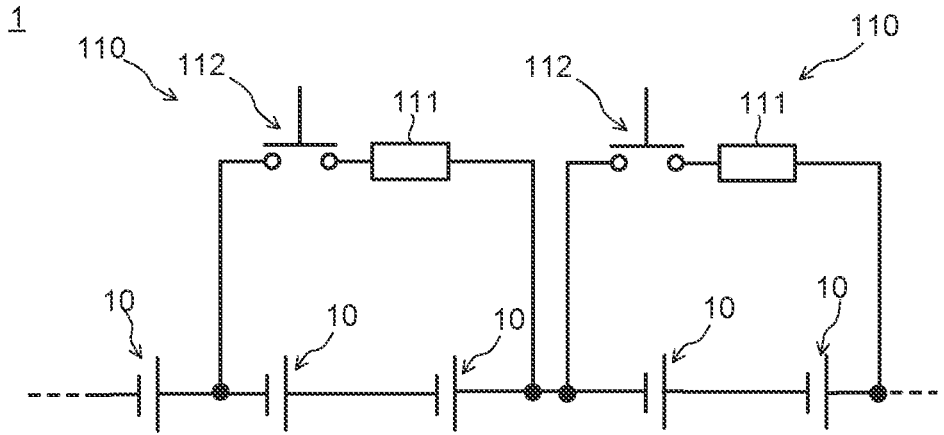
FIG. 6A illustrates an example of the parallel element section according to a variation.
Figure 6B:
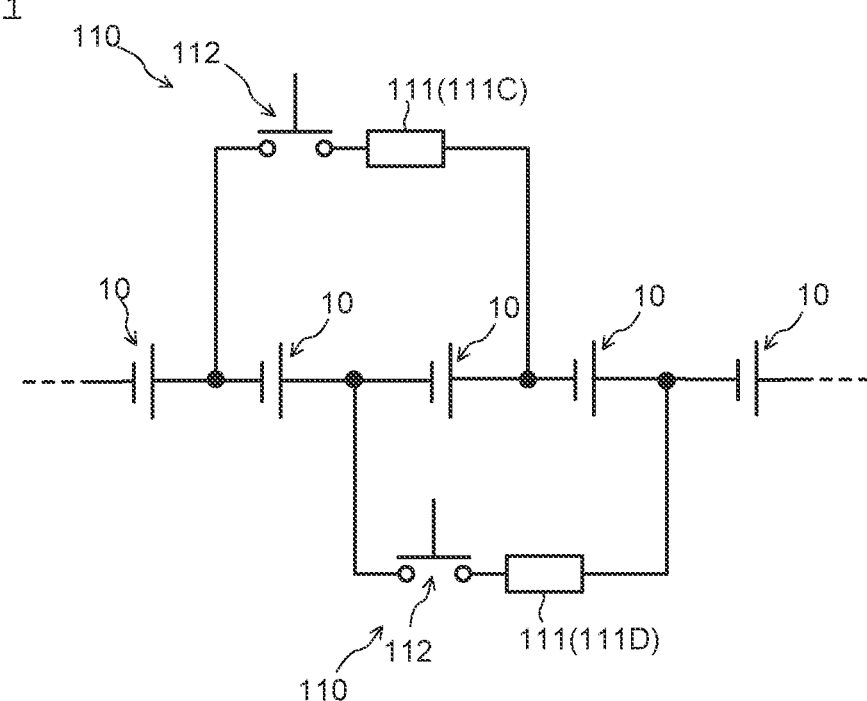
FIG. 6B illustrates an example of the parallel element section according to a variation.

In the configurations illustrated in FIG. 6A and FIG. 6B, one parallel element section 111 is connected in parallel with two secondary batteries 10.

The states of the plurality of secondary batteries can also be easily understood in such a configuration. Further, since the parallel element section 111 is provided corresponding to two or more secondary batteries 10, the number of parallel element sections 111 can be reduced.

In the configuration illustrated in FIG. 6B, a single secondary battery 10 is connected to two parallel element sections 111 in an overlapping manner. To be more specific, one end of the single secondary battery 10 is connected to a third parallel element section 111C, and the other end of the secondary battery 10 is connected to a fourth parallel element section 111D. Note that the other end of the secondary battery 10 is connected to the fourth parallel element section 111D via the first switching section 112 connected to the fourth parallel element section 111D.

In the configuration illustrated in FIG. 6A, it is only possible to specify a location of the parallel element section 111 corresponding to a deteriorated secondary battery 10. In contrast, in the configuration illustrated in FIG. 6B, one secondary battery 10 is connected to two parallel element sections 111 in an overlapping manner, and thus, when the secondary battery 10 is deteriorated, it is possible to specify that the secondary battery 10 is deteriorated by switching each of the first switching sections 112 corresponding to the two parallel element sections 111 and switching the impedance characteristic.

Consequently, the deteriorated secondary battery 10 can be accurately specified in the configuration illustrated in FIG. 6B.

In the above embodiment, the parallel element section 111 is configured to have only a capacitor, but the present invention is not limited to this, and other electrical circuit elements may be configured to be included in addition to the capacitor.

Further, in the above embodiment, the series element section 121 is configured to have only a coil, but the present invention is not limited to this, and the series element section 121 may be configured to have only a resistance element, or may be configured to include other electrical circuit elements in addition to the coil or the resistance element. In the case where the series element section is configured to have only a coil, the resistance value is 0, and it is thus possible to perform the assessment measurement while charging and discharging the battery pack. In the case where the series element section is configured to have only a resistance element, the resistance element may have infinite resistance. In this case, the series element section may be configured to be in an open circuit state, and the above assessment method is valid by considering that the impedance of the series element section is infinite. When the resistance element has infinite resistance, there is no difference between the second measurement and the fourth measurement described above, thereby reducing the number of times of measurement as a whole.

Further, in the above embodiment, the plurality of parallel element sections 111 have the same electrical parameter, but the present invention is not limited to this, and they may have different electrical parameters.

In addition, in the above embodiment, the plurality of series element sections 121 have the same electrical parameter, but the present invention is not limited to this, and they may have different electrical parameters.

In the above embodiment, the parallel element section 111 and the series element section 121 are used in combination, that is, the series-connected secondary battery and the parallel-connected secondary battery are combined, but the present invention is not limited to this. For example, only one of the parallel element section and the series element section, that is, only the parallel-connected secondary battery or only the series-connected secondary battery may be configured to be provided, or the configuration may correspond to all possible combinations of the series-connected secondary battery and the parallel-connected secondary battery.

Although the control section 130 is an ECU in the above embodiment, the present invention is not limited to this, and it may be an external device. Examples of the external device include a device installed in a vehicle and capable of measuring the impedance characteristic while in use or inactive, a device installed in a vehicle charging facility and capable of measuring the impedance characteristic during charging, and an independent measurement device for measuring the impedance characteristic in a repair shop or a recycling facility.

Further, in the above embodiment, the assessment method based on the flowchart illustrated in FIG. 3 is used, but the present invention is not limited to this, and another method such as a method of calculating the impedances of all the secondary batteries 10 may be used.

As for the rest, the above described embodiment merely illustrates an example of embodiment for practicing the present disclosure, and the technical scope of the present disclosure shall not be construed to be limited thereto. In other words, the present disclosure can be practiced in various forms without deviating from the gist or essential characteristics of the present invention.

The present disclosure is based on Japanese Patent Application (No. 2021-155462) filed on Sep. 24, 2021, and the contents are incorporated herein by reference in its entirety.

INDUSTRIAL APPLICABILITY

A battery pack of the present invention is useful for a battery pack and an assessment method each capable of understanding the conditions of a plurality of secondary batteries easily.

REFERENCE SIGNS LIST

1 Battery pack
10 Secondary battery
100 Assessment section
110 First circuit section
111 Parallel element section
112 First switching section
120 Second circuit section
121 Series element section
122 Second switching section
130 Control section

The invention claimed is:

1. A battery pack with a plurality of secondary batteries, the battery pack being capable of assessing at least one of the plurality of secondary batteries and comprising:

an electrical circuit element section that is used in assessing the plurality of secondary batteries and is placed such that the electrical circuit element section is connectable to at least one of the plurality of secondary batteries; and a first switching section and a second switching section that are connected to the electrical circuit element section and at least one of the plurality of secondary batteries and are configured to switch an impedance characteristic of the battery pack as a whole between use of the electrical circuit element section and non-use of the electrical circuit element section, wherein:

the electrical circuit element section comprises a parallel element section placed in parallel with at least one of the plurality of secondary batteries and a series element section placed in series with at least one of the plurality of secondary batteries, the first switching section is placed in series with the parallel element section, and sets at least one of the parallel element section and the plurality of secondary batteries in a disconnected state during the non-use, and sets at least one of the parallel element section and the plurality of secondary batteries in a connected state during the use, and the second switching section is placed in parallel with the series element section, and is set in a conductive state during the non-use, and is set in a non-conductive state during the use.

2. The battery pack according to claim 1, wherein a plurality of the parallel element sections are provided corresponding to the plurality of secondary batteries respectively.

3. The battery pack according to claim 1, wherein:

the parallel element section is configured to adjust an electrical parameter, and the first switching section switches the electrical parameter in the parallel element section between the use and the non-use.

4. The battery pack according to claim 1, wherein the parallel element section comprises a capacitor.

5. The battery pack according to claim 1, wherein:

the plurality of secondary batteries includes a plurality of groups connected in parallel with each other, and a plurality of the series element sections are provided corresponding to the plurality of groups respectively.

6. The battery pack according to claim 1, wherein:

the series element section is configured to adjust an electrical parameter, and the second switching section switches the electrical parameter in the series element section between the use and the non-use.

7. The battery pack according to claim 1, wherein the series element section comprises at least one of a resistance or a coil.

8. An assessment method for a battery pack comprising a plurality of secondary batteries, an electrical circuit element section that is used in assessing at least one of the plurality of secondary batteries and is placed such that the electrical circuit element section is connectable to at least one of the plurality of secondary batteries, and a first switching section and a second switching section that are connected to the electrical circuit element section and at least one of the plurality of secondary batteries, wherein the electrical circuit element section comprises a parallel element section placed in parallel with at least one of the plurality of secondary batteries and a series element section placed in series with at least one of the plurality of secondary batteries, the first switching section is placed in series with the parallel element section, and the second switching section is placed in parallel with the series element section, the assessment method, comprising:

switching an impedance characteristic of the battery pack as a whole between use of the electrical circuit element section and non-use of the electrical circuit element section; and assessing at least one of the plurality of secondary batteries, wherein in the switching an impedance characteristic of the battery pack as a whole:

the first switching section sets at least one of the parallel element section and the plurality of secondary batteries in a disconnected state during the non-use, and sets at least one of the parallel element section and the plurality of secondary batteries in a connected state during the use, and the second switching section is set in a conductive state during the non-use, and is set in a non-conductive state during the use.

9. A battery pack with a plurality of secondary batteries, the battery pack being capable of assessing at least one of the plurality of secondary batteries and comprising:

an electrical circuit element section that is used in assessing the plurality of secondary batteries and is placed such that the electrical circuit element section is connectable to at least one of the plurality of secondary batteries;

a first switching section and a second switching section that are connected to the electrical circuit element section and at least one of the plurality of secondary batteries and are configured to switch an impedance characteristic of the battery pack as a whole between use of the electrical circuit element section and non-use of the electrical circuit element section; and a plurality of series groups in which the plurality of secondary batteries are connected in series, the plurality of series groups connected in parallel with each other, wherein:

at least one of the series groups comprises a first circuit section connected in parallel with at least one of the plurality of the secondary batteries included in the at least one of the series groups, each of the series groups including the first circuit section comprises a second circuit section connected in series with at least one of the plurality of the secondary batteries, the first circuit section comprises a parallel element section and the first switching section connected in series with the parallel element section, the first switching section sets the first circuit section and the secondary battery in a disconnected state during non-use of the first circuit section, and sets the first circuit element section and the secondary battery in a connected state during use of the first circuit section, the second circuit section comprises a series element section and the second switching section connected in parallel with the series element section, the second switching section sets the second switching section in a conductive state during non-use of the second circuit section, and sets the second switching section in a non-conductive state during use of the second circuit section, the battery pack further comprises a control section that controls the first switching section and the second switching section during use of and non-use of the first circuit section and the second circuit section, and the control section assesses at least one of the plurality of secondary batteries based on impedance of the battery pack as a whole acquired by switching at least one of the first switching section or the second switching section.

10. A battery pack with a plurality of secondary batteries, the battery pack being capable of assessing at least one of the plurality of secondary batteries and comprising:

an electrical circuit element section that is used in assessing the plurality of secondary batteries and is placed such that the electrical circuit element section is connectable to at least one of the plurality of secondary batteries;

a first switching section and a second switching section that are connected to the electrical circuit element section and at least one of the plurality of secondary batteries and are configured to switch an impedance characteristic of the battery pack as a whole between use of the electrical circuit element section and non-use of the electrical circuit element section; and a plurality of parallel groups in which the plurality of secondary batteries are connected in parallel, the plurality of parallel groups connected in series with each other, wherein:

at least one of the parallel groups comprises a second circuit section connected in series with at least one of the plurality of the secondary batteries included in the at least one of the parallel groups, each of the parallel groups including the second circuit section comprises a first circuit section connected in parallel with at least one of the plurality of the secondary batteries, the first circuit section comprises a parallel element section and the first switching section connected in series with the parallel element section, the first switching section sets the first circuit section and the secondary battery in a disconnected state during non-use of the first circuit section, and sets the first circuit element section and the secondary battery in a connected state during use of the first circuit section, the second circuit section comprises a series element section and the second switching section connected in parallel with the series element section, the second switching section sets the second switching section in a conductive state during non-use of the second circuit section, and sets the second switching section in a non-conductive state during use of the second circuit section, the battery pack further comprises a control section that controls the first switching section and the second switching section during use of and non-use of the first circuit section and the second circuit section, and the control section assesses at least one of the plurality of secondary batteries based on impedance of the battery pack as a whole acquired by switching at least one of the first switching section or the second switching section.

11. An assessment method for a battery pack comprising a plurality of secondary batteries, an electrical circuit element section that is used in assessing at least one of the plurality of secondary batteries and is placed such that the electrical circuit element section is connectable to at least one of the plurality of secondary batteries, and a first switching section and a second switching section that are connected to the electrical circuit element section and at least one of the plurality of secondary batteries, the assessment method comprising:

switching an impedance characteristic of the battery pack as a whole between use of the electrical circuit element section and non-use of the electrical circuit element section; and assessing at least one of the plurality of secondary batteries, wherein:

the battery pack comprises a plurality of series groups in which the plurality of secondary batteries are connected in series, the plurality of series groups connected in parallel with each other, at least one of the series groups comprises a first circuit section connected in parallel with at least one of the plurality of the secondary batteries included in the at least one of the series groups, each of the series groups including the first circuit section comprises a second circuit section connected in series with at least one of the plurality of the secondary batteries, the first circuit section comprises a parallel element section and the first switching section connected in series with the parallel element section, the first switching section sets the first circuit section and the secondary battery in a disconnected state during non-use of the first circuit section, and sets the first circuit element section and the secondary battery in a connected state during use of the first circuit section, the second circuit section comprises a series element section and the second switching section connected in parallel with the series element section, the second switching section sets the second switching section in a conductive state during non-use of the second circuit section, and sets the second switching section in a non-conductive state during use of the second circuit section, the battery pack further comprises a control section that controls the first switching section and the second switching section during use of and non-use of the first circuit section and the second circuit section, and the assessing comprises assessing by the control section at least one of the plurality of secondary batteries based on impedance of the battery pack as a whole acquired by switching at least one of the first switching section or the second switching section.

12. An assessment method for a battery pack comprising a plurality of secondary batteries, an electrical circuit element section that is used in assessing at least one of the plurality of secondary batteries and is placed such that the electrical circuit element section is connectable to at least one of the plurality of secondary batteries, and a first switching section and a second switching section that are connected to the electrical circuit element section and at least one of the plurality of secondary batteries, the assessment method, comprising:

switching an impedance characteristic of the battery pack as a whole between use of the electrical circuit element section and non-use of the electrical circuit element section; and assessing at least one of the plurality of secondary batteries, wherein:

the battery pack comprises a plurality of parallel groups in which the plurality of secondary batteries are connected in parallel, the plurality of parallel groups connected in series with each other, at least one of the parallel groups comprises a second circuit section connected in series with at least one of the plurality of the secondary batteries included in the at least one of the parallel groups, each of the parallel groups including the second circuit section comprises a first circuit section connected in parallel with at least one of the plurality of the secondary batteries, the first circuit section comprises a parallel element section and the first switching section connected in series with the parallel element section, the first switching section sets the first circuit section and the secondary battery in a disconnected state during non-use of the first circuit section, and sets the first circuit element section and the secondary battery in a connected state during use of the first circuit section, the second circuit section comprises a series element section and the second switching section connected in parallel with the series element section, the second switching section sets the second switching section in a conductive state during non-use of the second circuit section, and sets the second switching section in a non-conductive state during use of the second circuit section, the battery pack further comprises a control section that controls the first switching section and the second switching section during use of and non-use of the first circuit section and the second circuit section, and the assessing comprises assessing by the control section at least one of the plurality of secondary batteries based on impedance of the battery pack as a whole acquired by switching at least one of the first switching section or the second switching section.

* * * * *